United States Patent
Wang et al.

(10) Patent No.: US 9,921,678 B2
(45) Date of Patent: Mar. 20, 2018

(54) SELF-POWERED, ULTRA-SENSITIVE, FLEXIBLE TACTILE SENSORS BASED ON CONTACT ELECTRIFICATION

(71) Applicants: Zhong Lin Wang, Atlanta, GA (US); Guang Zhu, Atlanta, GA (US)

(72) Inventors: Zhong Lin Wang, Atlanta, GA (US); Guang Zhu, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 0 days.

(21) Appl. No.: 14/818,908

(22) Filed: Aug. 5, 2015

(65) Prior Publication Data
US 2016/0070392 A1 Mar. 10, 2016

Related U.S. Application Data

(60) Provisional application No. 62/033,384, filed on Aug. 5, 2014.

(51) Int. Cl.
*G06F 3/041* (2006.01)
*H03K 17/96* (2006.01)

(52) U.S. Cl.
CPC ........ *G06F 3/0414* (2013.01); *H03K 17/96* (2013.01); *H03K 17/964* (2013.01);
(Continued)

(58) Field of Classification Search
CPC ........ G06F 2203/013; G06F 2203/014; G06F 2203/015; G06F 3/011; G06F 3/012; G06F 3/013; G06F 3/014; G06F 3/016; G06F 3/0416; G06F 3/0418; G06F 345/173; G06F 2203/041; G06F 3/03547; G06F 3/0412;
(Continued)

(56) References Cited

U.S. PATENT DOCUMENTS 4,126,822 A * 11/1978 Wahlstrom ............... H02N 1/08
 310/309
4,990,813 A 2/1991 Paramo
(Continued)

OTHER PUBLICATIONS

Notification of related application: commonly owned U.S. Appl. No. 14/189,656, filed Feb. 25, by Wang et al.
(Continued)

*Primary Examiner* — Grant Sitta
(74) *Attorney, Agent, or Firm* — Bryan W. Bockhop; Bockhop Intellectual Property Law, LLC

(57) ABSTRACT

A tactile sensor for sensing touch from a human finger includes a triboelectric layer and includes a material that becomes electrically charged after being in contact with the finger. The first side of a first conductive layer is in contact with the second side of triboelectric layer. The first side of a dielectric layer is in contact with the first conductive layer and the second side of the dielectric layer is in contact with a second conductive layer. When the triboelectric layer becomes electrically charged after being in contact with the finger, the first conductive layer and the second conductive layer are subjected to an electric field, which has a first field strength at the first conductive layer and a second field strength, different from the first field strength, at the second conductive layer. A plurality of tactile sensors can be arranged as a keyboard.

19 Claims, 6 Drawing Sheets

(52) U.S. Cl.
CPC .............. *H03K 17/9643* (2013.01); *G06F 2203/04102* (2013.01); *G06F 2203/04103* (2013.01)

(58) Field of Classification Search
CPC ........ G06F 3/0414; G06F 3/046; G06F 3/041; G06F 3/047; G06F 2203/04102; G06F 2203/04103; H05K 9/0073; H05K 9/0079; H05K 9/0081; H05K 9/0088; H03K 17/964; H03K 17/96; H03K 17/9643
USPC .................................................. 345/156–176
See application file for complete search history.

(56) References Cited

U.S. PATENT DOCUMENTS

| | | | | |
|---|---|---|---|---|
| 6,031,378 | A * | 2/2000 | Rosin | G01R 29/12 324/452 |
| 8,901,802 | B1 * | 12/2014 | Que | H01L 41/1136 310/330 |
| 9,178,446 | B2 | 11/2015 | Wang et al. | |
| 2005/0048293 | A1 | 3/2005 | Rood | |
| 2007/0201174 | A1 * | 8/2007 | Hynes | G06K 19/06196 361/56 |
| 2008/0024917 | A1 * | 1/2008 | Hynes | B42D 25/373 360/134 |
| 2008/0036038 | A1 | 2/2008 | Hersee et al. | |
| 2009/0150992 | A1 * | 6/2009 | Kellas-Dicks | G06F 21/32 726/19 |
| 2010/0085169 | A1 * | 4/2010 | Poupyrev | G06F 3/03543 340/407.2 |
| 2010/0133006 | A1 | 6/2010 | Shakra et al. | |
| 2011/0043077 | A1 * | 2/2011 | Yeh | F03G 7/005 310/338 |
| 2011/0050181 | A1 * | 3/2011 | Post | H02N 1/04 320/166 |
| 2011/0148248 | A1 * | 6/2011 | Landa | H01J 45/00 310/306 |
| 2012/0162057 | A1 * | 6/2012 | Tan | G06F 3/011 345/156 |
| 2012/0182222 | A1 * | 7/2012 | Moloney | G06F 3/0487 345/173 |
| 2012/0242619 | A1 * | 9/2012 | Reis Barbosa | G06F 3/011 345/174 |
| 2013/0049531 | A1 * | 2/2013 | Wang | H02N 1/04 310/309 |
| 2013/0063393 | A1 * | 3/2013 | Kurishima | B32B 7/02 345/174 |
| 2013/0106758 | A1 * | 5/2013 | Radivojevic | G06F 3/044 345/174 |
| 2013/0321331 | A1 * | 12/2013 | Chang | G06F 3/047 345/174 |
| 2014/0084748 | A1 * | 3/2014 | Wang | H02N 11/002 310/300 |
| 2014/0204053 | A1 * | 7/2014 | Crandall | G06F 3/044 345/174 |
| 2014/0313141 | A1 * | 10/2014 | Park | G06F 1/1635 345/173 |
| 2015/0035408 | A1 * | 2/2015 | Despesse | H02N 1/08 310/310 |
| 2015/0054773 | A1 * | 2/2015 | Jiang | G06F 3/016 345/174 |
| 2015/0123513 | A1 * | 5/2015 | Kim | H02N 1/08 310/300 |
| 2015/0242057 | A1 * | 8/2015 | Galela | G06F 3/0428 345/175 |
| 2015/0355710 | A1 * | 12/2015 | Modarres | G09G 5/003 345/173 |
| 2015/0362948 | A1 * | 12/2015 | Wada | G06F 1/16 345/173 |
| 2015/0363019 | A1 * | 12/2015 | Schediwy | G06F 3/044 345/174 |
| 2016/0149518 | A1 * | 5/2016 | Wang | H02N 1/04 310/310 |
| 2016/0209278 | A1 * | 7/2016 | Hus | G01L 1/16 |
| 2016/0218640 | A1 * | 7/2016 | Wang | H02N 1/04 |
| 2017/0160718 | A1 * | 6/2017 | Tanabe | G05B 19/402 |
| 2017/0187307 | A1 * | 6/2017 | Wang | H02N 1/04 |

OTHER PUBLICATIONS

Zhu, Guang: "Triboelectric-Generator-Driven Pulse Electrodeposition for Micropatterning"; Nano Letters, Aug. 13, 2012; ACS.
Notification of Related U.S. Appl. No. 14/032,864, filed Sep. 20, 2013 by Wang et al.
Notification of Related U.S. Appl. No. 14/314,141, filed Jun. 25, 2014 by Wang et al.
Notification of Related U.S. Appl. No. 14/447,132, filed Jul. 30, 2014 by Wang et al.
Notification of Related U.S. Appl. No. 14/818,982, filed Aug. 5, 2015 by Wang et al.

* cited by examiner

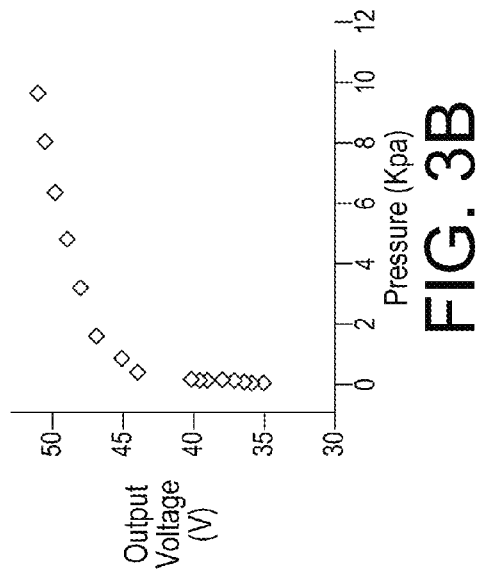
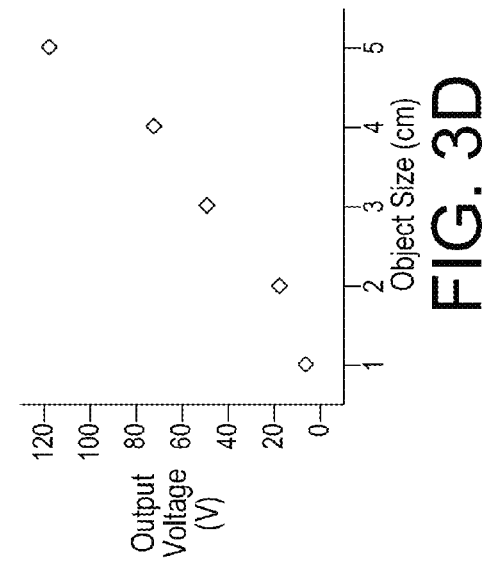
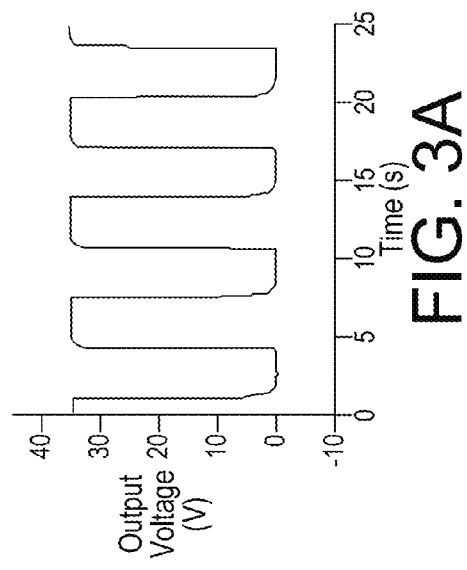
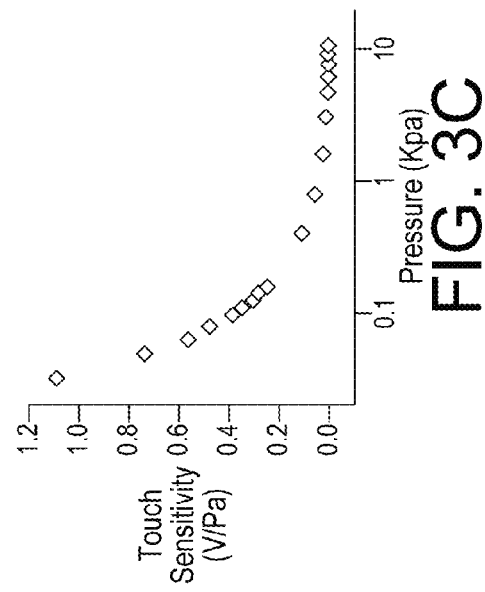
FIG. 3A
FIG. 3B
FIG. 3C
FIG. 3D

SELF-POWERED, ULTRA-SENSITIVE, FLEXIBLE TACTILE SENSORS BASED ON CONTACT ELECTRIFICATION

CROSS-REFERENCE TO RELATED APPLICATIONS

This application claims the benefit of U.S. Provisional Patent Application Ser. No. 62/033,384, filed Aug. 5, 2014, the entirety of which is hereby incorporated herein by reference.

STATEMENT OF GOVERNMENT INTEREST

This invention was made with government support under agreement No. DE-FG02-07ER46394, awarded by the Department of Energy. The government has certain rights in the invention.

BACKGROUND OF THE INVENTION

1. Field of the Invention

The present invention relates to touch sensors and, more specifically, to a touch sensor that is self-powering.

2. Description of the Related Art

Tactile (or touch) sensing is a field that is rapidly advancing as driven by vast applications including human-machine interfacing, skin-like electronics, industrial automation, medical procedures, and security systems. Tactile sensors, according to transducing mechanisms, can be divided into following major categories: capacitive, piezoelectric, resistive, and optical. All of these mechanisms rely on deformation of the sensing unit in response to interaction with an object. Such a deformation-dependence poses a challenge in touch detection when very weak interaction is involved. Another major limitation of aforementioned sensors is that they all require an external power supply to generate an electrical parameter for characterizing the output of the sensor; otherwise none of them can normally operate. This causes problems such as power consumption and structural complexity. Besides, fragility, stiffness, and high cost are also common concerns that impair widespread adoption of tactile sensors.

Computers are one of the most indispensable equipment that each and every one of us relies on each day. Accessing the information provided by computer from internet dictates the quality, efficiency and happiness of our work and life. A keyboard, an indispensable component of the system, is the only means for information input and control for many purposes such as information recording/outputting, financial management, bill payment, personal communications and many more. With this regard, the heavy reliance on computer incurs a major concern for its security issue. A breach of information security due to unauthorized access to computers will widely jeopardize people's normal lives, business development, company operation and even national security. Conventional security measures such as PINs, tokens, or passwords can only provide limited protections since they themselves are subject to illegitimate activities. One weakness of the current authentication systems is that an identity thief can easily pass as the genuine owner with stolen personal identification information (e.g., a password). Behavioral biometric of keystroke dynamics can be harnessed to place an additional layer of stronger security on existing systems since biometric identifiers are intrinsic and harder to separate or mimic.

Therefore, there is a need for a self-powered touch sensor. There is also a need for a keyboard that can sense identifiable characteristics of the user.

SUMMARY OF THE INVENTION

The disadvantages of the prior art are overcome by the present invention which, in one aspect, is a tactile sensor for sensing touch from a human finger and the like that includes a triboelectric layer, having a first side and an opposite second side, that includes a material that becomes electrically charged after being in contact with the finger. A first conductive layer has a first side and an opposite second side. The first side of the first conductive layer is in contact with the second side of triboelectric layer. A second conductive layer, has a first side and an opposite second side. A dielectric layer has a first side and an opposite second side. The first side of the dielectric layer is in contact with the second side of the first conductive layer and the second side of the dielectric layer is in contact with the first side of the second conductive layer. The dielectric layer has a width so that when the triboelectric layer becomes electrically charged after being in contact with the finger, the first conductive layer and the second conductive layer are subjected to an electric field, wherein the electric field has a first field strength at the first conductive layer and a second field strength, different from the first field strength, at the second conductive layer.

In another aspect, the invention is a keyboard for sensing contact with at least one human finger that includes a plurality of independently addressable tactile sensitive keys. Each key including a different tactile sensor. Each different tactile sensor includes: a triboelectric layer, having a first side and an opposite second side, that includes a material that becomes electrically charged after being in contact with the finger; a first conductive layer, having a first side and an opposite second side, the first side of the first conductive layer in contact with the second side of triboelectric layer; a second conductive layer, having a first side and an opposite second side; and a dielectric layer, having a first side and an opposite second side, the first side of the dielectric layer in contact with the second side of the first conductive layer and the second side of the dielectric layer in contact with the first side of the second conductive layer, the dielectric layer having a width so that when the triboelectric layer becomes electrically charged after being in contact with the finger, the first conductive layer and the second conductive layer are subjected to an electric field, wherein the electric field has a first field strength at the first conductive layer and a second field strength, different from the first field strength, at the second conductive layer. An interface circuit generates a signal indicative of an electric field difference between the first conductive layer and the second conductive layer in at least one key when the difference is sensed.

In one aspect, the interface circuit generates the signal so as to indicate an amount of pressure exerted by the finger on the key at a specific moment. In one aspect, the a circuit identifies a user based on changes in the signal over time.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

BRIEF DESCRIPTION OF THE FIGURES OF THE DRAWINGS

FIGS. 3A-3D are a series of graphs that relate output voltage of a tactile sensor to several parameters.

DETAILED DESCRIPTION OF THE INVENTION

Figure 1A:
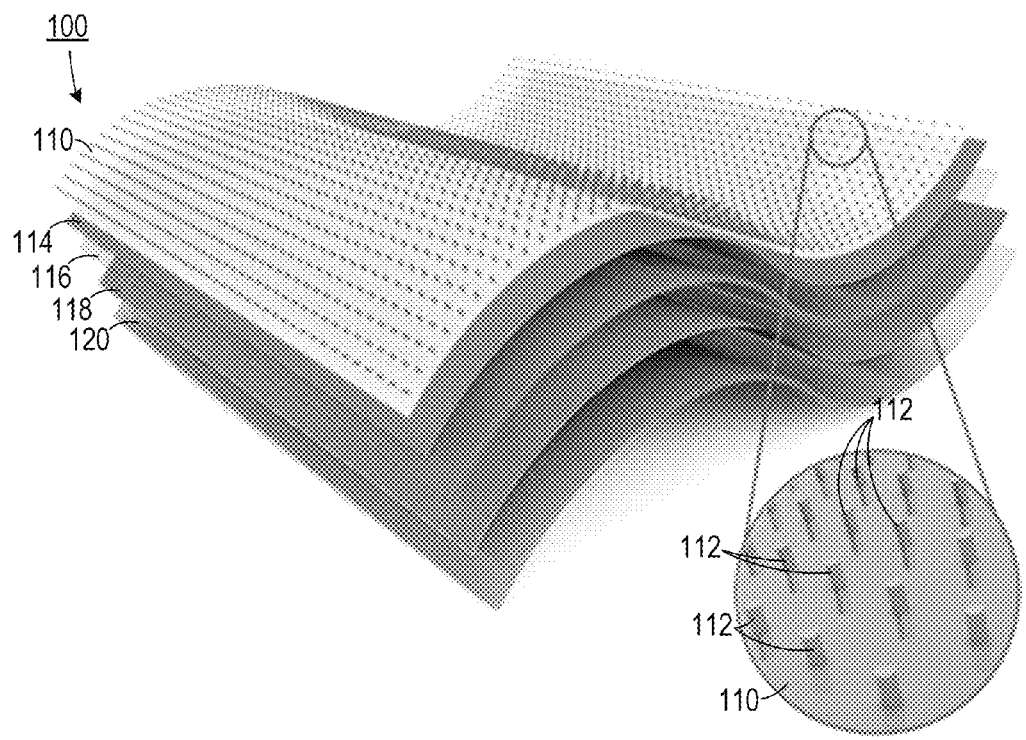
FIG. 1A is a schematic drawings of a tactile sensor.

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on."

U.S. patent application Ser. No. 13/598,132, filed on Aug. 29, 2012 by Wang et al. and published as US-2013-0049531-A1 and U.S. patent application Ser. No. 14/189,656, filed on Aug. 25, 2014 by Wang et al. and published as US-2014-0246950-A1 each disclose methods of fabricating and operation of triboelectric generators and are therefore incorporated herein by reference.

Figure 1B:
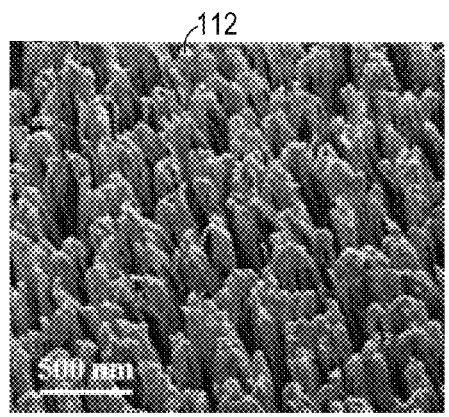
FIG. 1B is a micrograph of nanowires extending outwardly from the triboelectric layer of a tactile sensor.
Figure 2:
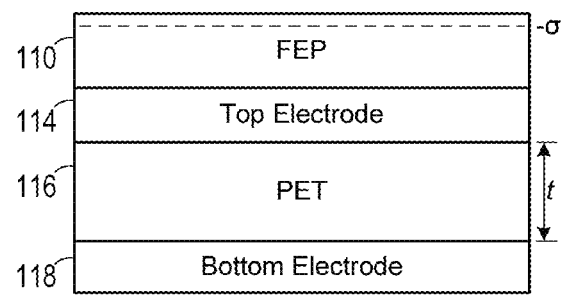
FIG. 2 is a schematic diagram of one embodiment of a tactile sensor demonstrating charge distribution therein.

As shown in FIGS. 1A-1B and FIG. 2, one embodiment of self-powered triboelectric sensors (TES) 100 includes a triboelectric FEP layer 110, a first ITO conductive layer 114, a PET dielectric layer 116, a second ITO conductive layer 118 and a nylon substrate layer 120. The thin-film-based TES 100 utilizes contact electrification to generate a voltage signal in response to a physical contact without reliance on an external power supply, completely resolving the issue of power consumption for the sensing unit. Enabled by the sensing mechanism and surface modification/functionalization based on polymer-nanowires 112, the TES 100 shows a pressure sensitivity of 44 mV/Pa (0.09% Pa$^{-1}$) and a maximum touch sensitivity of 1.1 V/Pa (2.3% Pa$^{-1}$) in extremely low-pressure region (<0.15 KPa). Since contact electrification is universally applicable to any material, the TES 100 can effectively respond to either insulating or conductive materials of all kinds. Having a flexible structure, it can be tailored to any size, shape and color/colorless, making it adaptive to even curved surfaces. More importantly, through integration of the TES 100 with a signal-processing circuit, a complete tactile sensing system can be developed. Diverse applications of the system can be demonstrated, explicitly indicating a variety of immediate uses in human-electronics interface, automatic control, surveillance, remote operation, and security systems.

A TES 100 can be composed of thin-film materials that are vertically laminated. A layer of polyethylene terephthalate (PET) 116 forms structural backbone of the TES 100 which is sandwiched by transparent ITO layers 114 and 118 as electrodes on both sides. On the top side, a layer of fluorinated ethylene propylene (FEP) 110 is applied as an electrification layer that generates triboelectric charges upon contact with a foreign object. Surface modification on the FEP 110 can be adopted to create vertically aligned polymer nanowires (PNWs) 112. They have an average diameter and length of 150 nm and 1.5 μm, respectively, which play an important role in achieving high sensitivity for low pressure detection. On the bottom side, a nylon film 120 serves as a protection substrate layer due to its outstanding mechanical and thermal properties.

The self-powered operating principle of the TES 100 can be explained by the coupling effect between contact electrification and electrostatic induction. Due to large composition percentage of fluorine that has the highest electronegativity among all elements, the FEP is one of the most triboelectric-negative materials. It always tends to gain negative charges when in contact with almost any other materials. At the "contact state" in which a foreign object (such as a human finger) is in touch with the TES, as shown in FIG. 2 and FIGS. 6A-6D, triboelectric charges are generated at the contact surfaces, with negative ones on the TES side and positive ones on the object side. They are balanced by their opposite counterparts, which does not induce an open-circuit voltage across the two electrodes. At the "separation state" when the object is absent, the negative triboelectric charges do not annihilate but remain on the surface of the TES for an extended period of time. These charges introduce a net electric field between the two electrodes. Since the top electrode is closer to the negative charges than the bottom electrode, it possesses a lower electric potential compared to the bottom one. Considering that the top and the bottom electrodes are connected to the positive and the negative terminals of a load (such as a measurement system), the open-circuit voltage across the electrodes at the separation state can be analytically expressed by Equation (1) below.

$$V = U_{top} - U_{bottom} = \frac{-\sigma t}{2\varepsilon_0 \varepsilon_r} \tag{1}$$

where $U_{top}$ is the electric potential of the top electrode, $U_{bottom}$ is the electric potential of the bottom electrode, $-\sigma$ is the negative triboelectric charge density on the FEP, t is the distance between the two electrodes that is equivalent to the PET substrate thickness, $\varepsilon_0$ is the dielectric constant of vacuum, and $\varepsilon_r$ is the relative permittivity of PET. Based on this equation, the separation and the contact states correspond to the minimum and the maximum values of the open-circuit voltage, respectively. The independence of an external power supply for electric signal generation is an unparalleled feature compared to any other tactile sensing technique.

To characterize the response of the TES to a contact event, we used the output voltage defined as the difference of the open-circuit voltage with respect to that at the separation state. Consequently, the output voltage always has a positive value, which has a zero-baseline corresponding to the separation state. Here, a square-shaped TES having an edge length of 5 cm was utilized to detect a metal object with a planar dimension of 2.5 cm by 2.5 cm. Repetitive contact and separation were realized through a linear motor that provided a precisely controlled reciprocating motion. Details on measurement setup as well as sample preparation are presented in Methods.

As shown in FIG. 3A, at a contact force of 20 mN (applied pressure of 0.03 KPa) the TES produces a uniform square-wave output voltage with the maximum amplitude of 35 V. As the contact force/pressure increases, the output voltage rises and finally saturates at 50 V when the contact pressure approaches 10 KPa, as shown in FIG. 3B. This increasing behavior can be attributed to the increase of contact area. High pressure results in more contact area, which imparts higher density of surface charges to the TES. As a result, higher output voltage is obtained. It is noticed that the curve in FIG. 3B exhibits two distinct regions. In the extremely low-pressure region (<0.15 KPa), an exceptional pressure sensitivity[25] of 44 mV/Pa is achieved with excellent linearity ($R^2=0.991$), corresponding to a sensitivity factor of 0.09% $Pa^{-1}$. In the region beyond 2 KPa, the pressure sensitivity drops to 0.5 mV/Pa but still has good linearity ($R^2=0.974$). It is suggested that the two-region behavior is likely due to the enhancement effect resulting from the PNWs on the TES surface. The sensed object has surface asperities at micro and nano scale. Without the PNWs, the contact between two nominal flat surfaces is confined at certain points due to the surface asperities. In comparison, the high-aspect-ratio PNWs are likely to be readily bent and become adaptive to the morphology of the sensed object in a weak contact. Such a conformable interaction can result in largely enhanced increment of the real contact area in response to an increase of the pressure because it requires much less pressure to deform the PNWs than the bulk FEP film. As a result, the device with the PNWs exhibits a much more sensitive response in the low-pressure region (<0.15 KPa). The nanowire-based modification leads to a 7-fold enhancement in the pressure sensitivity for ultra-low pressure detection. It needs to be noted that a proper length of the PNWs is important for the sensitivity enhancement. On one hand, the enhancement was not observed for short PNWs (~600 nm in FIG. S3a) due to possibly ineffective interaction with the contact object. On the other hand, excessively long PNWs (>3 μm) tend to fall down after a number of contacts (FIG. S3b), which reveals poor mechanical robustness.

To further characterize the ability of the TES in responding to a contact event, touch sensitivity is calculated and plotted in FIG. 3C. The touch sensitivity reaches an ultra-high value of 1.1 V/Pa, corresponding to a factor of 2.3% $Pa^{-1}$. It indicates the superior applicability of the TES in detecting a touch event especially when the interaction is week. It is found that the PNW-based modification can also largely promote the touch sensitivity by as much as 150% compared to the device without the modification. The PNWs can possibly increase the number of contact points by accommodating the surface asperities by the comfortable interaction.

The size can be an important factor that determines the output voltage as well as the sensitivity of the TES. For a TES with a fixed size (5 cm in side length), a quadratic increase in output voltage is obtained with respect to side length of the sensed object that varies from 1 cm to 5 cm, as shown in FIG. 3D. Alternatively, the output voltage linearly scales with the object area. The reason is that a larger object imparts more triboelectric charges to the TES, which induces a higher potential in magnitude on the upper electrode given that the electrode has a fixed area. It has been found that the output voltage is reversely proportional to the device area while the sensed object has a fixed size. If both the TES and the object scale altogether, the output voltage keeps stable. Therefore, an important guidance in achieving high sensitivity is that the TES needs to have a lateral dimension smaller than an object that is to be detected.

Figure 4B:
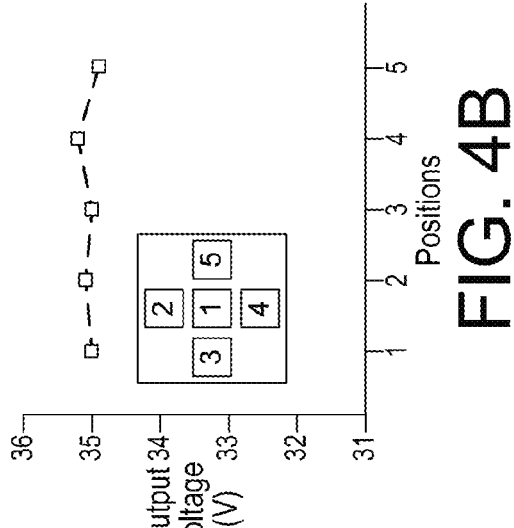
FIGS. 4A-4D are a series of graphs that relate normalized voltage and output voltage of a tactile sensor to several parameters.
Figure 4D:
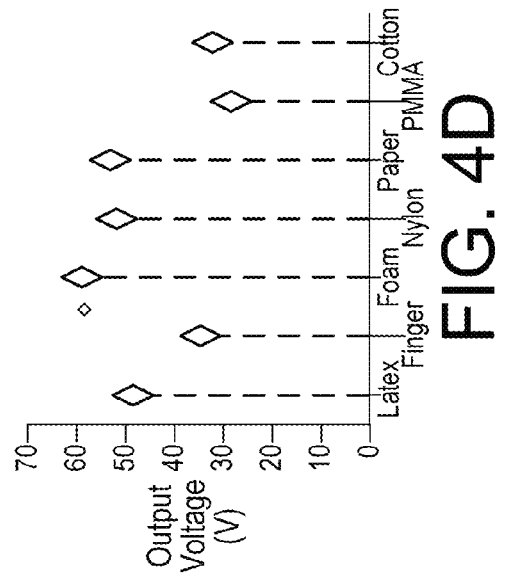
Figure 4A:
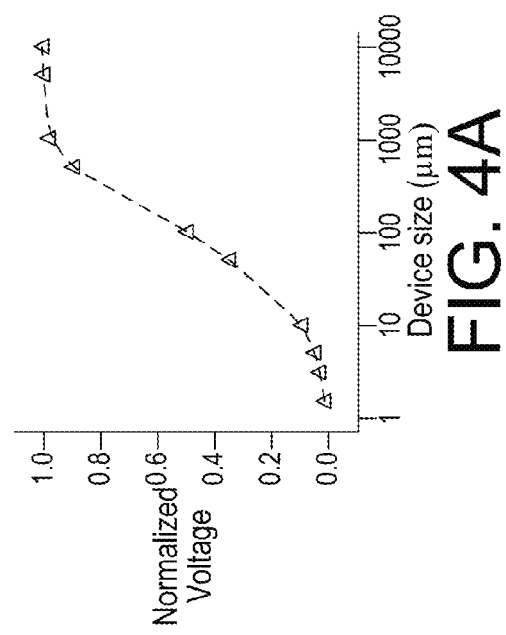

The TES can still be fully functional when the lateral dimension is scaled down to micro-scale. Equation (1) is based on the assumptions that the FEP surface is infinitely large and uniformly charged. These assumptions can hold true only on the condition that the lateral dimension is far larger than the PET thickness. If the TES is substantially scaled down, the edge effect can become dominant. Then the electric field between the two electrodes is not uniform anymore. As a result, the magnitude of the open-circuit voltage will drop, as shown in FIG. 4A, based on the COMSOL simulation data. At macro-scale, the output voltage is independent of the lateral dimension, which is consistent with Equation (1). However, as the lateral dimension is scaled down to below 10 times of the PET thickness (<500 μm), the output voltage starts to substantially drop. The normalized voltage decreases to 0.5 and 0.1 when the lateral dimension shrinks to 100 μm and 10 μm, respectively. The output voltage can still reach about 3.5 V for a pixel size as small as 10 μm, which can be easily measured.

Figure 4C:
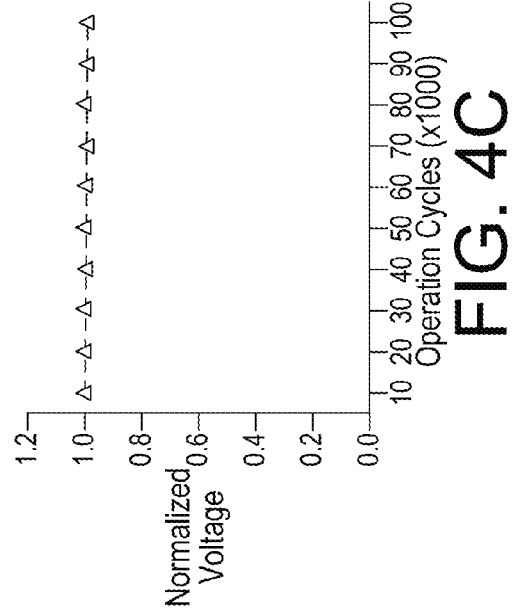

In addition to ultra-high sensitivity and self-generated output, the TES features a number of other merits. An important aspect in evaluating a tactile sensor is the output dependence on locations where a touch event takes place. Values of output voltage at 5 different locations are shown in FIG. 4B, where the TES (5 cm in side length) interacts with a metal object having a side length of 1 cm. The five locations are depicted in inset of FIG. 4B. The output proves to be independent of the location, which is indicative of uniform sensing when addressing small-sized objects. Moreover, the TES has a robust structure and is made from durable materials. As a result, it exhibits excellent durability. After repetitive contacts for $10^5$ cycles at a frequency of 1 Hz with a pressure of 20 KPa, the output voltage shows only a slight fluctuation within 1%, as shown in FIG. 4C. The output voltage is independent of the contact frequency considering that the surface triboelectric charges dissipate very slowly and they can be replenished in each contact even though the dissipation is significant. Additionally, the TES is generally applicable to objects that are made of various materials. A survey of outputs in response to materials that are commonly found for daily usage is shown in FIG. 4D, which reveals the widespread applicability of the TES in a variety of circumstances.

A thin-film-based triboelectric sensor (TES) can be used for ultra-sensitive tactile sensing without an external power source. From fundamental innovation point of view, the TES relies on triboelectrification resulting from a contact event to generate an output voltage and does not consume any electric energy from an external power source. Thus, the self-powered TES represents a breakthrough concept for tactile sensing/imaging. From device performance point of view, due to the novel sensing mechanism as well as diverse surface chemical and physical modifications on PNWs, the TES has achieved an ultra-high level of pressure sensitivity as well as touch sensitivity in an extremely low-pressure region. Besides, high levels of uniformity, stability, and applicability have also been achieved. Finally, from practical application point of view, a complete sensing system was built through integrating a TES with a signal-processing circuit. A variety of applications were demonstrated, in which the TES could sensitively trigger functional electronics in response to common external excitations, such as finger touching, hand grabbing, and foot pressing. Considering that the TES features other major advantages in scalability, cost, and implementation, it has a promising prospect for robotics, human-machine interfacing and security.

In one example of a TES being fabricated, the following steps are performed: 1. Prepare a PET substrate of 50 μm thickness with a desired dimension using laser cutting; 2. Deposit 150 nm of ITO on both sides of the PET as electrodes using a RF sputterer; 3. Connect a lead wire to each of the electrodes; 4. Adhere a nylon thin film (50 μm) on one side of the device as a protection layer; 5. Adhere a FEP thin film (50 μm) on the other side of the device as an electrification layer; 6. Create vertically aligned polymer nanowires on the FEP surface using plasma dry etching.

Figure 5:
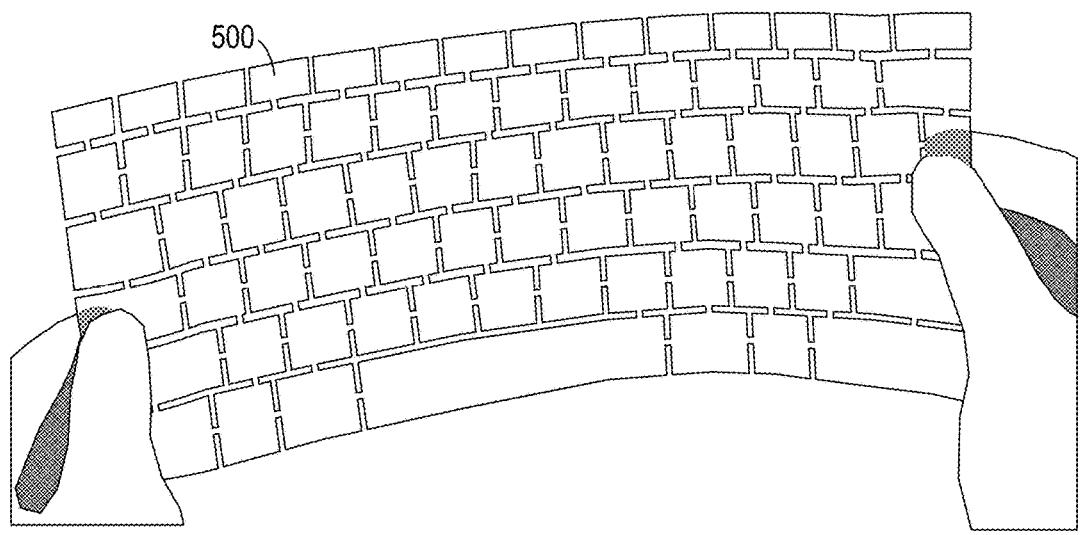
FIG. 5 is a photograph of a keyboard employing the invention.

As shown in FIG. 5, an intelligent self-powered keyboard 500, made from a plurality of TES-type sensors, can be used as an advanced safeguard against unauthorized access to computers. Based on contact electrification, between human fingers and keys, the intelligent keyboard (IKB) converts typing motions on the keyboard into locally electric signals that can be harnessed for either touch-sensing or energy-harvesting purposes. The IKB allows a direct identification of users in data input using the dynamic electronic signals generated when striking keys.

Through integration of the IKB with a signal-processing circuit, a complete touch sensing system can be generated. A wireless alarm can be triggered once a finger gently taps on a key. Furthermore, each key is individually addressable, which enables tracing and recording the typing content in real time. This capability will provide administrators with the ability to identify unauthorized users of keyboards, ATM machines, door entry devices and the like.

The typing-induced electric signals from each key can not only differentiate keystroke timing but also quantitatively record concrete dynamic changes in the course of typing using the self-generated electric current and voltage signals. It offers an accurate, unique, and permanent typing pattern for further verification and recognition purposes. In one experiment, Daubechies Wavelet of order 4 (DB4) was employed to successfully classify and identify the typing patterns of several different individuals.

Furthermore, the keyboard can also convert mechanical energy from human typing into electricity. With an area power density of 69.6 μWcm$^{-2}$, the keyboard can effectively harness the typing motions to generate electricity and to charge small electronics at arbitrary typing speed greater than 100 characters per min (CPM). Holding a surface contact angle of 160° due to surface nanostructure modification, the IKB is an effective self-cleaner, which keeps itself free of dirt and grime. Even a sweaty hand can barely degrade the output performance, and it is also easy to be cleaned up even if the contamination occurs.

Figure 6A:
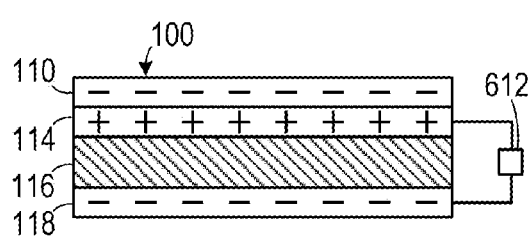
FIGS. 6A-6D are a series of schematic diagrams that show triboelectrification resulting from contact.
Figure 6B:
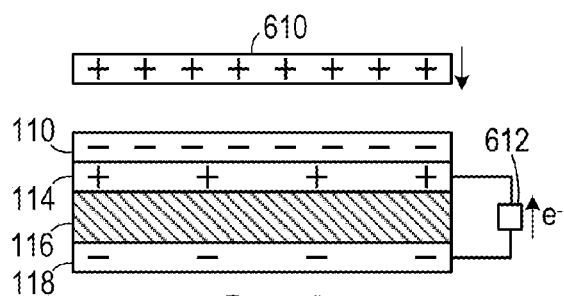
Figure 6C:
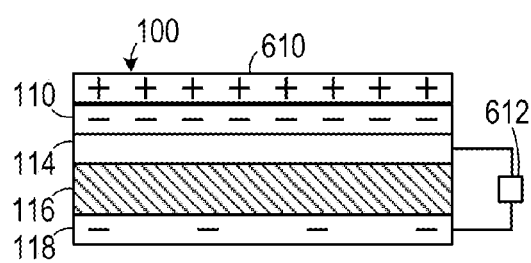
Figure 6D:
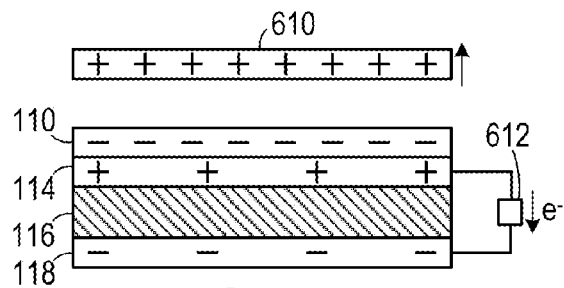

The key functional element (KFE) of the IKB is composed of vertically-stacked transparent thin film materials that form a tactile sensor. A layer of polyethylene terephthalate (PET) sits between two layers of ITO that are the bottom and the top electrodes. Then, a layer of fluorinated ethylene propylene (FEP) is applied onto the ITO surface as an electrification layer that generates triboelectric charges upon contact with human fingers. FEP nanowires arrays can be generated on the exposed FEP surface by a top-down method through reactive ion etching. The static contact angle of the FEP surface was measured by a sessile droplet method with a 2 μl water droplet. The superhydrophobicity of the IKB surface assures its self-cleaning property, which can effectively keep the keyboard free of dirt and grime. P The basic working principle of the IKB is based on the coupling between contact electrification and electrostatic induction rather than the traditional mechanical switching. An electricity generation process from a key unit is depicted in FIGS. 6A-6D. When a human finger 610 is brought into contact with FEP 110, charge transfer at the contact interface occurs. According to the triboelectric series, electrons are injected from human skin into FEP 110, since FEP is much more triboelectrically negative than human skin, generating positive triboelectric charges on the human skin and negative ones on the FEP 110. Subsequently, if the human finger 610 moves away, the negative charges on the FEP 110 side will induce positive charges on the top ITO electrode 114 and thus equal amount of negative charges on the bottom electrode 118 (as shown in FIG. 6A). Once a keystroke is initiated, the positively charged human finger 610 approaches the keyboard, the induced positive charges on the top electrode 114 are expelled, resulting in a flow of free electrons from the bottom electrode 118 to top electrode 114 (as shown in FIG. 6B) until the finger 610 and the key are in contact (as shown in FIG. 6C). When the finger 610 separates, free electrons flow backward from the top electrode 114 to the bottom electrode 118 (as shown in FIG. 6D). This is a full cycle of the electricity-generating process. It is worth noting that the triboelectric charges don't dissipate but remain on the FEP surface 110 for an extended period of time. Consequently, consecutive keystrokes result in a periodicaly-changing electric field that drives reciprocating flows of electrons between electrodes.

The keyboard can be integrated with a signal-processing circuit to develop a complete wireless warning system. Once a finger gently strokes a key, the generated voltage signal triggers an IC timer that controls a wireless transmitter and remotely switches a siren between a panic state and a silence state. The keys in the keyboards are categorized into seven regions according to their dimensions to compare their output voltage.

For recognition purpose, the maximum peak value of the output voltage from channel i, $V_{pi}$, is extracted. Then the threshold voltage $V_{th}$ can be analytically expressed by the following equation using Pauta Criterion Method.

$$V_{th} = \frac{1}{n}\sum_{i=1}^{n} V_{pi} + \frac{3}{\sqrt{n}}\sqrt{\sum_{i=1}^{n} V_{pi}(V_{pi}-1)} \qquad (2)$$

where n is the total number of channels, and i is integral from 1 to n. Once the extracted $V_{pi}$ is higher than $V_{th}$, the key corresponding to this particular channel is considered to be stroked.

Figure 7A:
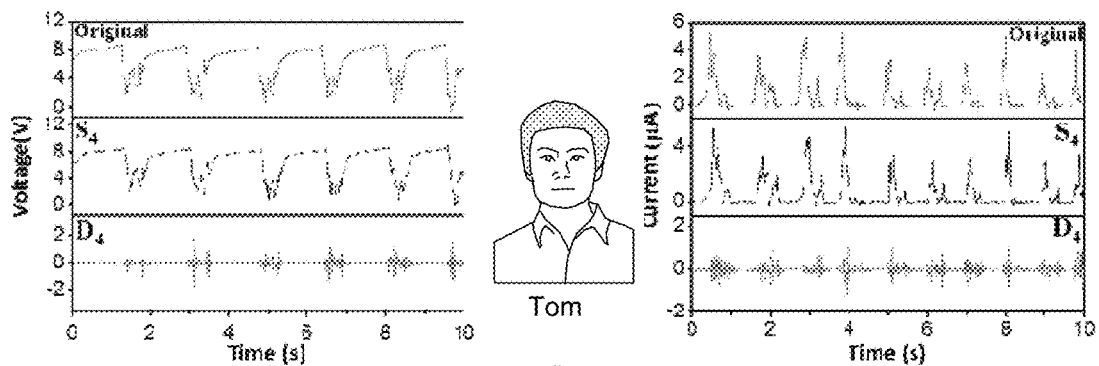
FIGS. 7A-7C are a series of graphs that demonstrate identifying characteristics of different individuals using a keyboard employing tactile sensors.
Figure 7B:
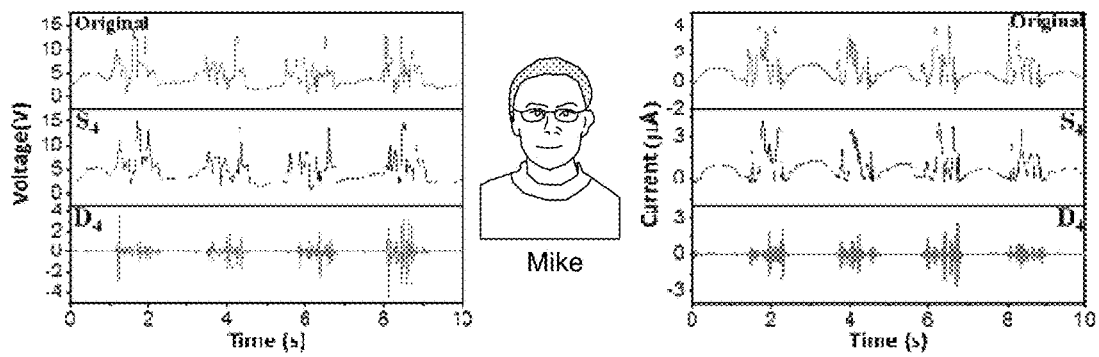
Figure 7C:
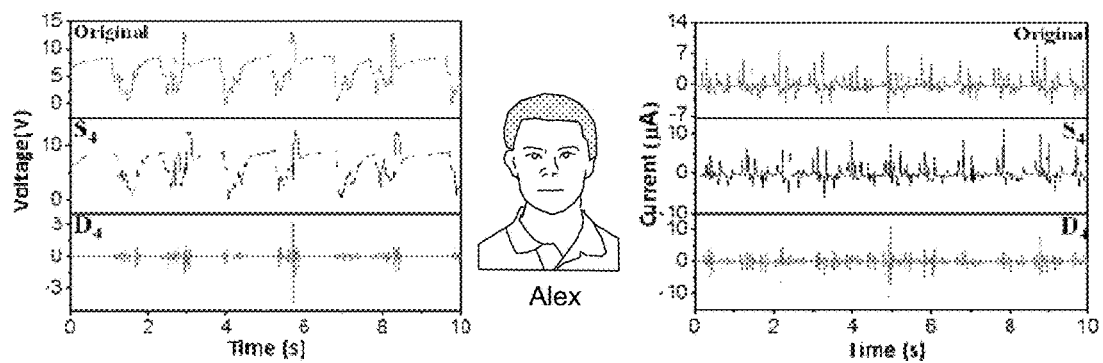

Typing patterns based on dimensional keystroke timing vector, lacking of uniqueness and permanence, largely hinder the practicality and acceptability of behavioral biometric of keystroke dynamics as effective identifier to current authentication system. The IKB in this work provides a superior route in creating accurate, unique, and permanent typing patterns for verification and identification purposes. In one example, as demonstrated in FIGS. 7A-7C, three sets of original typing patterns (in red curves) were respectively obtained for three typists Tom, Mike, and Alex, who independently typed the word "touch" for more than four times on the IKB in each accustomed manner. Each set of typing pattern corresponds to two subsets of characteristic signals (voltage and current), which are time-series data. These electric signals correlate to a variety of information, including the manner and rhythm of the keystroke, typing habit, finger size, individual bioelectricity, and typing force. Thus, they can not only characterize the keystroke timing, but also quantitatively record the concrete dynamic changes in the course of typing.

The as-collected electric signals look apparently different from each other. For quantitative differentiation, Discreet Fourier Transformation (DFT) was performed to obtain frequency features of the electric signals. The frequency spectrums of the voltage and the current from different individuals are distinct in term of the position and the amplitude of the major signal components. Furthermore, Wavelet transformation was further carried out to simultaneously obtain both time domain and frequency domain features of the typing patterns. Based on DB4, the typing patterns in the form of electric signals can be expressed by the following formula via multiresolution analysis $$f(t) = S_4(t) + D_4(t) + D_3(t) + D_2(t) + D_1(t) \quad (3)$$

$$\text{and } S_4 = \Sigma_k s_{4,k} \varphi_{4,k}(t) \quad (4)$$

$$D_j = \Sigma_k d_{j,k} \psi_{j,k}(t) \quad (5)$$

where $S_{4,k}$ and $d_{j,k}$ are the wavelet coefficients, j=1, 2, 3, 4. k is the number of translations of the wavelet for any given scale. $\varphi_{4,k}(t)$ and $\psi_{j,k}(t)$ are respectively the father wavelets and mother wavelets. f(t) is either voltage or current signal of the typing patterns. $S_4$ is smooth. Wavelet details $D_4$, $D_3$, $D_2$ and $D_1$ represent a set of voltage or current components that provide representations of the original signals at different resolution levels.

On the basis of DB4 results, the corresponding higher resolution wavelet components of three individuals are significantly different from each other. Still, Pearson correlation coefficient was utilized to quantitatively measure the correlation between the wavelet components by the following equation $$\gamma = \frac{\sum_{i=1}^{n}(t_i - \bar{t})(x_i - \bar{x})}{\sqrt{\sum_{i=1}^{n}(t_i - \bar{t})^2}\sqrt{\sum_{i=1}^{n}(x_i - \bar{x})^2}} \quad (6)$$

where n is the length of compared date sequence, and x is either the voltage or the current sequences after DB4. The obtained Pearson correlation coefficient of $D_4$ and $S_4$ components are respectively tabulated in Table 1, as follows:

|  | Tom | | Mike | | Alex | |  | Tom | | Mike | | Alex | |
|---|---|---|---|---|---|---|---|---|---|---|---|---|---|
| Voltage | $S_4$ | $D_4$ | $S_4$ | $D_4$ | $S_4$ | $D_4$ | Current | $S_4$ | $D_4$ | $S_4$ | $D_4$ | $S_4$ | $D_4$ |
| Tom | 0.91 | 0.92 | 0.43 | 0.45 | 0.45 | 0.43 | Tom | 0.92 | 0.89 | 0.44 | 0.41 | 0.42 | 0.39 |
| Mike | 0.43 | 0.45 | 0.86 | 0.87 | 0.42 | 0.34 | Mike | 0.42 | 0.41 | 0.85 | 0.85 | 0.36 | 0.35 |
| Alex | 0.45 | 0.43 | 0.42 | 0.34 | 0.88 | 0.89 | Alex | 0.42 | 0.39 | 0.36 | 0.35 | 0.88 | 0.89 |

All of the Pearson correlation coefficients of the voltage or current components from each individual are larger than 0.85, suggesting superior permanence of the typing patterns, while other Pearson correlation coefficients are less than 0.45 that is indicative of excellent uniqueness among individuals. Therefore, the DFT along with the Wavelet transformation prevents large false acceptance rate and false rejection rate. Given the exceptional recognition ability demonstrated above, the IKB is able to identify the personal character of typing individuals, making it practical for developing a highly secured authentication system based on behavioral biometrics.

Enabled by the contact electrification and electrostatic induction between human fingers and the keys, an intelligent self-powered keyboard can effectively convert the typing motions on the keyboard into local electronic controlling signals, which can be harnessed for either touch sensing or energy harvesting purpose. Through integration of the IKB with a signal-processing circuit, the IKB is able to trigger a wireless alarm when a keystroke was launched onto the keyboard. This self-securing functionality of the IKB promises greater flexibility for users dealing with intrusions. It is worth noting that contact electrification is a universal effect that exists for almost all of the materials, coupling with the surface FEP nanowires enabled superior touching sensitivity, the IKB can effectively respond to either insulating or conductive materials of any kinds, even a glove-wearing intrusion or imposture could be effectively detected.

The IKB is thus capable of tracing the typing motions and recording the typing contents in real-time. Acting as an advanced safeguard against unauthorized access to computer resources, the IKB provides great convenience to security administrators for impostors and intruders identifying.

Furthermore, the IKB is able to identify the personal characters of typing individuals using keystroke dynamics. The triboelectrification induced electric signals by the human typing motions not only relate to the manner and rhythm of the keystroke, but also concern a lot of personalities, such as typing habit, the size of the personal fingers, individual bioelectricity, the applied typing press force, the typing speed, and so on. Consequently, these signals can not only characterize the property of keystroke timing, but also quantitatively record the concrete dynamic changes in the course of typing motions, and thus they provide an unprecedentedly accurate, unique and permanent typing pattern for further verification and identification purposes. Meanwhile, individual typing patterns are successfully classified and identified using DB4, which justified the effectiveness and practicality of the typing patterns as identifiers.

In addition, the IKB is able to convert human typing, which is normally ignored and discarded, into electricity. Under keystroke repetitive typing model, the "II" keys are evaluated and an area power density of 69.6 $\mu Wcm^{-2}$ was delivered. While under the continuously typing working mode, the IKB can also effectively harness the type motions to generate power and charge a commercial capacitor at a rate of 0.019 $Vs^{-1}$ at a moderate typing speed of 350 CPM. The IKB provides a feasible means of utilizing the wasted typing energy and has the potential of developing itself into a self-powered working manner. At least, it is capable of extending throughout the runtime of small battery-operated systems, such as remotes, wireless keyboard, and wireless mice. And also, holding a surface superhydrophobicity owning to nanostructure modification, the IKB is an effective self-cleaner, which keeps itself free of dirt and grime.

In one method of fabricating a Nanowires Array on FEP Surface, the following steps may be performed: (1) The FEP film was washed ordinally with menthol, isopropyl alcohol, and deionized water, then dried with compressed nitrogen; (2) Using a DC sputter, coated a layer of 10 nm thickness Au onto the FEP film as a nanoscale mask for creating the surface roughness; (3) Put the Au coated FEP in to ICP chamber, and introduce $O_2$, Ar and $CF_4$ gases into the ICP chamber with the flow ratio of 10.0, 15.0 and 30.0 sccm, respectively; (4) Use one power source of 400 W to generate a large density of plasma while another power source of 100 W to accelerate plasma ions towards the FEP surface; (5) ICP reactive ion etching for 60 seconds.

In one method of fabricating a key functional element, the following steps may be performed: (1) Deposit 100 nm ITO on both sides of a PET substrate of 50 μm thickness using a RF sputter; (2) According to the key distribution of a keyboard, cut the ITO coated PET substrate into the desired design using a laser cutter. And the surface ITO can be selectively erased by the laser cutter to form functional electrical pathways. (3) Connect lead wires to the top and bottom ITO electrodes at the end of each pathway. (4) Adhere a FEP thin film (50 μm) on one side of the device as an electrification layer. (5) Using the laser cutter to trim away the redundant part of the FEP layer and make it consistent with the designed PET pattern.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A tactile sensor for sensing touch from a human finger and the like, comprising:
   (a) a triboelectric layer, having a first side and an opposite second side, that includes a material that is more triboelectricly negative than the finger so that it acquires electrons as a result of being in contact with the finger;
   (b) a first conductive layer, having a first side and an opposite second side, the first side of the first conductive layer in contact with the second side of triboelectric layer;
   (c) a second conductive layer, having a first side and an opposite second side; and
   (d) a dielectric layer, having a first side and an opposite second side, the first side of the dielectric layer in contact with the second side of the first conductive layer and the second side of the dielectric layer in contact with the first side of the second conductive layer, the dielectric layer having a width so that when the triboelectric layer becomes electrically charged after being in contact with the finger, the first conductive layer and the second conductive layer are subjected to an electric field, wherein the electric field has a first field strength at the first conductive layer and a second field strength, different from the first field strength, at the second conductive layer,
   wherein when the finger contacts the triboelectric layer, the triboelectric layer acquires electrons from the finger and is in charge balance with the finger and so that when the finger is taken out of contact with the triboelectric layer, electrons flow from the first conductive layer to the second conductive layer until the first conductive layer is in charge balance with the triboelectric layer.

2. The tactile sensor of claim 1, further comprising a substrate layer in contact with the second side of the second conductive layer.

3. The tactile sensor of claim 1, wherein the triboelectric layer comprises fluorinated ethylene propylene.

4. The tactile sensor of claim 1, wherein the triboelectric layer comprises a plurality of deformable nanostructures extending outwardly from the first side of the triboelectric layer so that the nanostructures are in contact with the finger when the finger is in contact with the triboelectric layer.

5. The tactile sensor of claim 1, further comprising an electrical load electrically coupled to the first conductive layer and electrically coupled to the second conductive layer.

6. The tactile sensor of claim 1, wherein the dielectric layer comprises polyethylene terephthalate.

7. The tactile sensor of claim 1, wherein the first conductive layer comprises indium tin oxide.

8. The tactile sensor of claim 1, wherein the second conductive layer comprises indium tin oxide.

9. A keyboard for sensing contact with at least one human finger, comprising:
   (a) a plurality of independently addressable tactile sensitive keys, each key including a different tactile sensor, wherein each different tactile sensor includes:
      (i) a triboelectric layer, having a first side and an opposite second side, that includes a material that is more triboelectricly negative than the finger so that it acquires electrons as a result of being in contact with the finger;
      (ii) a first conductive layer, having a first side and an opposite second side, the first side of the first conductive layer in contact with the second side of triboelectric layer;
      (iii) a second conductive layer, having a first side and an opposite second side; and
      (iv) a dielectric layer, having a first side and an opposite second side, the first side of the dielectric layer in contact with the second side of the first conductive layer and the second side of the dielectric layer in contact with the first side of the second conductive layer, the dielectric layer having a width so that when the triboelectric layer becomes electrically charged after being in contact with the finger, the first conductive layer and the second conductive layer are subjected to an electric field, wherein the electric field has a first field strength at the first conductive layer and a second field strength, different from the first field strength, at the second conductive layer
      wherein when the finger contacts the triboelectric layer, the triboelectric layer acquires electrons from the finger and is in charge balance with the finger and so that when the finger is taken out of contact with the triboelectric layer, electrons flow from the first conductive layer to the second conductive layer until the first conductive layer is in charge balance with the triboelectric layer; and
   (b) an interface circuit that, upon sensing an electric field difference between the first conductive layer and the second conductive layer in at least one key, generates a signal indicative thereof.

10. The keyboard of claim 9, wherein the interface circuit generates the signal so as to indicate an amount of pressure exerted by the finger on the key at a specific moment.

11. The keyboard of claim 10, further comprising a circuit that identifies a user based on changes in the signal over time.

12. The tactile sensor of claim 1, further comprising a plurality of nano-wires extending outwardly from the first side of the triboelectric layer so that the nanostructures are in contact with the finger when the finger is in contact with the triboelectric layer.

13. The tactile sensor of claim 1, further comprising a substrate layer disposed under the second conductive layer.

14. The keyboard of claim 10, further comprising a plurality of nano-wires extending outwardly from the first side of the triboelectric layer.

15. The keyboard of claim 10, further comprising a substrate layer disposed under the second conductive layer.

16. The keyboard of claim 10, wherein the triboelectric layer comprises fluorinated ethylene propylene.

17. The keyboard of claim 10, wherein the dielectric layer comprises polyethylene terephthalate.

18. The keyboard of claim 10, wherein the first conductive layer comprises indium tin oxide.

19. The keyboard of claim 10, wherein the second conductive layer comprises indium tin oxide.

* * * * *